United States Patent
Lee et al.

(10) Patent No.: US 11,118,266 B2
(45) Date of Patent: Sep. 14, 2021

(54) METHOD FOR DEPOSITING PROTECTION FILM OF LIGHT-EMITTING ELEMENT

(71) Applicant: TES CO., LTD, Gyeonggi-do (KR)

(72) Inventors: Hong-Jae Lee, Gyeonggi-do (KR); Jong-Hwan Kim, Chungcheongnam-do (KR); Woo-Pil Shim, Gyeonggi-do (KR); Woo-Jin Lee, Busan (KR); Sung-Yean Yoon, Gyeonggi-do (KR); Don-Hee Lee, Gyeonggi-do (KR)

(73) Assignee: TES CO., LTD, Yongin (KR)

( * ) Notice: Subject to any disclaimer, the term of this patent is extended or adjusted under 35 U.S.C. 154(b) by 7 days.

(21) Appl. No.: 16/189,660

(22) Filed: Nov. 13, 2018

(65) Prior Publication Data

US 2019/0078208 A1 Mar. 14, 2019

Related U.S. Application Data

(63) Continuation of application No. PCT/KR2017/005043, filed on May 16, 2017.

(30) Foreign Application Priority Data

May 18, 2016 (KR) .................. 10-2016-0060938

(51) Int. Cl.
| | | |
|---|---|---|
| C23C 16/44 | (2006.01) | |
| C23C 16/455 | (2006.01) | |
| H01L 51/56 | (2006.01) | |
| C23C 16/505 | (2006.01) | |
| H01L 33/44 | (2010.01) | |
| H01L 33/00 | (2010.01) | |
| H01L 33/02 | (2010.01) | |
| H01L 51/52 | (2006.01) | |
| C23C 16/34 | (2006.01) | |
| C23C 16/40 | (2006.01) | |

(52) U.S. Cl.
CPC ...... *C23C 16/45553* (2013.01); *C23C 16/345* (2013.01); *C23C 16/401* (2013.01); *C23C 16/403* (2013.01); *C23C 16/45523* (2013.01); *C23C 16/45555* (2013.01); *C23C 16/505* (2013.01); *H01L 33/00* (2013.01); *H01L 33/005* (2013.01); *H01L 33/02* (2013.01); *H01L 33/44* (2013.01); *H01L 51/5253* (2013.01); *H01L 51/56* (2013.01); *H01L 51/5256* (2013.01); *H01L 2251/56* (2013.01); *H01L 2933/0025* (2013.01)

(58) Field of Classification Search
CPC .................................................. C23C 16/455
See application file for complete search history.

(56) References Cited

U.S. PATENT DOCUMENTS

| 6,235,456 | B1 * | 5/2001 | Ibok ...................... G03F 7/091 |
| | | | 257/437 |
| 7,214,600 | B2 | 5/2007 | Won et al. |
| 9,647,186 | B2 | 5/2017 | Schmid et al. |
| 2004/0195960 | A1 * | 10/2004 | Czeremuszkin .... H01L 51/0096 |
| | | | 313/504 |
| 2005/0062052 | A1 * | 3/2005 | Yang ................... H01L 51/5253 |
| | | | 257/79 |
| 2007/0278946 | A1 * | 12/2007 | Ito .......................... H05B 33/22 |
| | | | 313/506 |
| 2011/0100458 | A1 | 5/2011 | Kang et al. |
| 2014/0117330 | A1 * | 5/2014 | Cho ..................... H01L 51/5256 |
| | | | 257/40 |
| 2014/0319488 | A1 * | 10/2014 | Lee ...................... H01L 51/5253 |
| | | | 257/40 |
| 2015/0104575 | A1 * | 4/2015 | Takoudis .......... C23C 16/45523 |
| | | | 427/255.35 |
| 2016/0095172 | A1 * | 3/2016 | Lee ....................... C23C 16/401 |
| | | | 313/504 |
| 2017/0053953 | A1 * | 2/2017 | Hirota ................. H01L 27/1218 |

FOREIGN PATENT DOCUMENTS

| JP | 09-205223 A | 5/1997 |
| JP | 2009-509036 A | 3/2009 |
| JP | 2011-511403 A | 4/2011 |
| JP | 2013-171982 A | 9/2013 |
| KR | 10-2012-0029284 A | 3/2012 |
| KR | 10-2013-0066164 A | 6/2013 |
| KR | 10-2014-0027811 A | 3/2014 |
| KR | 10-2014-0087470 A | 7/2014 |

OTHER PUBLICATIONS

First Office Action from Korean Intellectual Property Office for Korean Patent Application No. 10-2016-0060938, dated Feb. 17, 2017, English translation, 10 pages.
International Search Report for International Patent Application No. PCT/KR2017/005043, dated Aug. 25, 2017, 5 pages.
Summary of Taiwanese Office Action for Taiwanese Patent Application No. 10720182710, English summary, 3 pages.
Office Action dated Jan. 5, 2021 in corresponding Japanese Patent Application No. 2018-559188.

* cited by examiner

*Primary Examiner* — Austin Murata
(74) *Attorney, Agent, or Firm* — Mintz Levin Cohn Ferris Glovsky and Popeo, P.C.; Steven M. Jensen

(57) ABSTRACT

The present invention relates to a method for depositing a protection film of a light-emitting element, the method comprising the steps of: depositing a first protection layer on a light-emitting element of a substrate by means of the atomic layer deposition method; and depositing at least one additional protection layer on the first protection layer by means of the plasma-enhanced chemical vapor deposition method.

15 Claims, 6 Drawing Sheets

(A)   (B)

METHOD FOR DEPOSITING PROTECTION FILM OF LIGHT-EMITTING ELEMENT

CROSS-REFERENCE TO RELATED APPLICATIONS

This application is a continuation application of International Application No. PCT/KR2017/005043 filed on May 16, 2017, which claims priority to Korean Application No. 10-2016-0060938 filed on May 18, 2016. The applications are incorporated herein by reference.

TECHNICAL FIELD

The present invention relates to a method of depositing a protection film of a light-emitting diode (LED), and more particularly, to a method of depositing a protection film in a so-called hybrid form including all of a protection layer deposited by atomic layer deposition (ALD) and a protection layer deposited by plasma enhanced chemical vapor deposition (PECVD).

BACKGROUND ART

Recently, with development of the information age, research has been actively conducted into a display device and, in particular, a light emitting diode (LED) display or an organic light emitting diode (OLED) has drawn attention.

Such an OLED uses an organic material that autonomously emits light and has distinctly different characteristics from a conventional liquid crystal display (LCD), a plasma display panel (PDP), or the like. In particular, a display device using an OLED is a next-generate display device and is known as a so-called bendable display and, recently, has also been widely used as a display of various portable devices such as a cellular phone, a smartphone, and a tablet personal computer (PC).

An OLED is a device that generates an electron-hole pair in a semiconductor from an electron and a hole and emits light through a recombination procedure of the electron-hole pair. Such an OLED is capable of expressing all the three primary colors of light at a relatively low driving voltage and is excellent to acquire high resolution and natural color. It may be possible to produce a large-size display device with low expense and OLED advantageously has bendable characteristics and high response speed.

However, the above OLED includes a structure including an organic thin film and an electrode and, thus, has a problem in that the OLED is rapidly degraded when external moisture, oxygen, or the like penetrates thereinto. To overcome the problem, the OLED essentially needs a protection film that blocks moisture and oxygen.

Recently, a method of forming a protection film formed of an inorganic material as a multiple layer by atomic layer deposition (ALD) or plasma enhanced chemical vapor deposition (PECVD) has been developed.

However, ALD advantageously has a low water vapor transmission rate (WVTR) but has a problem in that it is difficult to realize a large size and, in particular, throughput is remarkably low.

Furthermore, a protection film formed by PECVD has a problem in that its flexible characteristics are degraded due to a relatively very thick thickness.

SUMMARY

An object of the present invention is to provide a method of depositing a protection film including a protection layer deposited by atomic layer deposition (ALD) and a protection layer deposited by plasma enhanced chemical vapor deposition (PECVD).

That is, the object of the present invention is to provide a method of depositing a protection film, for achieving a similar effect to the prior art while having a remarkably thin thickness compared with the prior art by depositing a protection layer, which has excellent step coverage, deposited by ALD on a light-emitting diode (LED) and depositing a protection layer by PECVD on the ALD protection layer.

Another object of the present invention is to provide a method of depositing a protection film, which provides a protection film having flexible characteristics while having a low water vapor transmission rate (WVTR), and a method of depositing a protection film applicable to a flexible display.

In the method of depositing a protection film of a lighting emitting diode (LED), the object of the present invention can be achieved by a method of depositing a protection film of a light emitting diode (LED) and the method includes depositing a first protection layer on an LED of a substrate by atomic layer deposition (ALD) and depositing at least one additional protection layer on the first protection layer by chemical vapor deposition.

Here, the first protection layer may be formed of an aluminum oxide (AlOx) layer deposited by ALD, and the additional protection layer may include a second protection layer formed of silicon nitride (SiNx) deposited on the first protection layer by chemical vapor deposition and a third protection layer formed of silicon oxide (SiOx) deposited on the second protection layer by chemical vapor deposition.

In the depositing of the first protection layer, a compound including aluminum (Al) may be supplied as source gas and $N_2O$ may be supplied as reaction gas.

In the depositing of the second protection layer, silane ($SiH_4$) gas may be supplied as precursor gas, $NH_3$ or $N_2$ may be supplied as reaction gas, and RF power density for plasma generation may have a value of 0.34 to 0.58 $W/cm^2$.

In the depositing of the third protection layer, any one selected from an organic precursor group consisting of tetramethyl-disiloxane (TMDSO), hexaethyl-disilane (HEDS), hexachloro-disilane (HCDS), hexamethyl-disiloxane (HMDSO), and bisdiethylamino-silane (BDEAS) may be supplied, $O_2$ or Ar may be supplied as reaction gas, and RF power density for plasma generation may have a value of 0.63 to 0.87 $W/cm^2$.

The method may further include depositing a buffer layer on the third protection layer. In this case, the buffer layer may be formed of silicon oxide including carbon. The depositing of the buffer layer and the depositing of the third protection layer may use the same organic precursor.

In this case, the depositing of the third protection layer and the depositing of the buffer layer may be successively performed. For example, as the depositing of the third protection layer proceeds to the depositing of the buffer layer, a supply amount of the reaction gas may be relatively reduced while a supply amount of the organic precursor is relatively increased.

A thickness ratio of the second protection layer and the third protection layer may be about 0.2 to 0.4:1.

In this case, a total thickness including the first to third protection layers may be 60 to 200 nm. In this case, the first protection layer may have a thickness of 10 to 20 nm, the second protection layer may have a thickness of 10 to 40 nm, and the third protection layer may have a thickness of 40 to 140 nm.

In the depositing of the first, second, and third protection layers, the first, second, and third protection layers may have reduced internal stress upward from the LED.

The depositing of the first protection layer and the depositing of the additional protection layer may be repeatedly performed to deposit a multi-layered protection film.

According to the aforementioned method of depositing a protection film, all of advantages of a protection film deposited by atomic layer deposition (ALD) and advantages of a protection film deposited by plasma enhanced chemical vapor deposition (PECVD) may be achieved.

That is, a first protection layer deposited on a light-emitting diode (LED) may be deposited by ALD and, thus, defects of a surface of the LED may be overcome by the protection layer with excellent step coverage deposited by ALD. In this case, the thickness of the first protection layer deposited by ALD may be relatively thinned to maintain flexible characteristics while reducing a time required for deposition.

When a second protection layer and a third protection layer are deposited on the first protection layer, a protection film including a silicon nitride layer and a silicon oxide layer may be deposited by PECVD and, thus, it may be possible to deposit a protection film having a remarkably thin thickness compared with a conventional protection film while having a low water vapor transmission rate (WVTR) similarly to the prior art.

In addition, a multi-layered protection film including the second protection layer with low moisture transmissivity and the third protection layer with flexible characteristics may be provided and, thus, may be applicable to a flexible display while preventing penetration of moisture and oxygen as much as possible.

In addition, the second protection layer and the third protection layer may be deposited in the same apparatus and, thus, a processing time required for deposition may be relatively reduced.

DETAILED DESCRIPTION

Hereinafter, reference is made in detail to various embodiments, examples of which are illustrated in the accompanying drawings.

With regard to a structure of an organic light emitting diode (OLED), the OLED includes an injection-type thin film device with an emissive layer and a transport layer. Accordingly, the OLED is the same as an inorganic semiconductor in that they are a light-emitting diode using P-N junction but is different from a P-N junction-type light emitting diode (LED) in that the P-N junction-type LED is controlled by recombination via injection of minority carriers at a junction interface and the OLED is configured in such a way that all carriers involved in emitting light are injected from an external electrode. That is, a carrier injection-type light-emitting diode requires an organic material by which a carrier is easily injected and moved.

Figure 1:
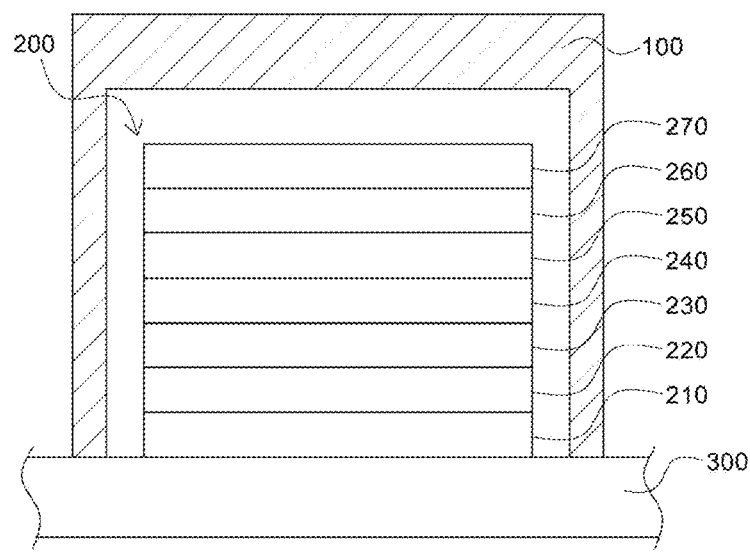
FIG. 1 is a schematic side cross-sectional view showing a structure of an organic light emitting diode (OLED).

FIG. 1 is a side cross-sectional view showing a structure of an OLED.

Referring to FIG. 1, an OLED 200 may include a stack structure including a substrate 300, an anode 210, a hole injection layer 220, a hole transport layer 230, an emissive layer 240, an electron transport layer 250, an electron injection layer 260, and a cathode 270 and may have a protection film 100 disposed on the OLED 200. The structure of the OLED 200 is well known to the art to which the present invention pertains and, thus, a detailed description thereof is omitted here.

As described above, an OLED includes a structure including an organic thin film and an electrode and, thus, has a problem in that the OLED is rapidly degraded when external moisture, oxygen, or the like penetrates thereinto and, accordingly, to overcome the problem, the OLED needs a protection film that blocks moisture and oxygen. In this case, the quality of the protection film may be slightly different depending on sensitivity with respect to a contamination factor.

Recently, a method of forming a protection film formed of an inorganic material as a multiple layer using an atomic layer deposition (ALD) or plasma enhanced chemical vapor deposition (PECVD) apparatus has been used. However, ALD advantageously has a low water vapor transmission rate (WVTR) but has a problem in that it is difficult to realize a large size and throughput is remarkably low. Furthermore, a protection film formed by PECVD has a problem in that flexible characteristics are degraded due to a relatively very thick thickness.

Accordingly, the present invention proposes a method of depositing a protection film that has a relatively thin thickness compared with the prior art, has a low WVTR value similarly to the prior art and, simultaneously, enhances throughput compared with the prior art. With reference to the drawings, the deposition method is now described.

Figure 2:
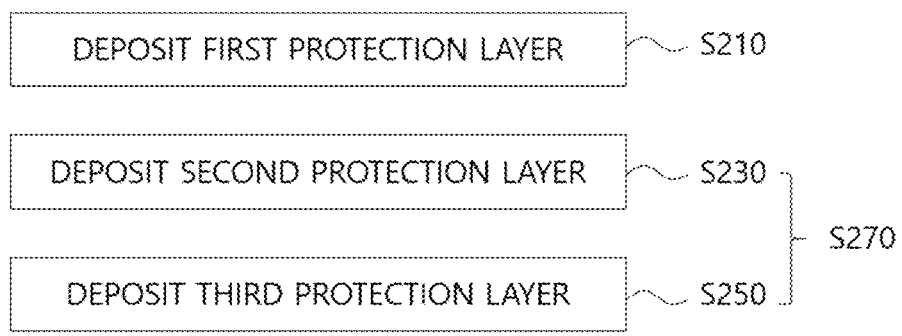
FIG. 2 is a flowchart showing a deposition procedure of a protection film according to the present invention.
Figure 3:
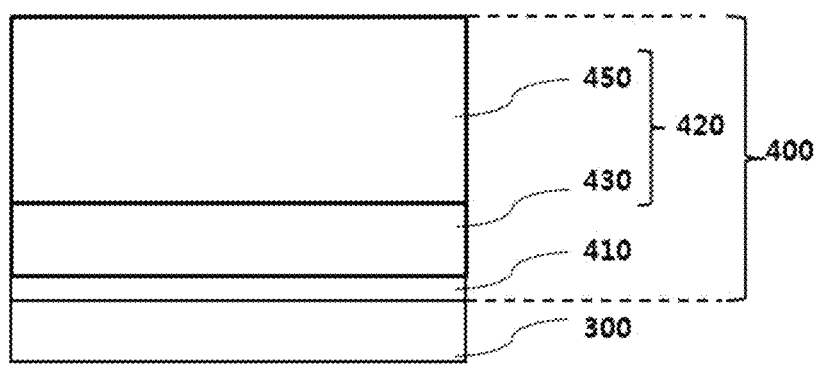
FIG. 3 is a cross-sectional view showing a protection film according to an exemplary embodiment of the present invention.

FIG. 2 is a flowchart showing a deposition procedure of a protection film according to the present invention. FIG. 3 is a cross-sectional view showing a protection film according to an exemplary embodiment of the present invention. In FIG. 3, for convenience, a light-emitting diode is omitted and a protection film is formed on a substrate.

Referring to FIGS. 2 and 3, the method of depositing a protection film according to the present invention may include depositing a first protection layer 410 on the OLED 200 of a substrate 300 by ALD (S210) and depositing at least one additional protection layer 420 on the first protection layer 410 by PECVD. In this case, the first protection layer 410 may be deposited by ALD and the additional protection layer 420 may be deposited by PECVD. The depositing of the additional protection layer 420 may include depositing a second protection layer 430 (S230) and a third protection layer 450 (S250).

For example, the first protection layer 410 may include an aluminum oxide (AlOx) layer deposited by ALD and the additional protection layer 420 may include the second protection layer 430 including a silicon nitride (SiNx) layer deposited by PECVD on the first protection layer 410 and the third protection layer 450 including a silicon oxide (SiOx) layer deposited on the second protection layer by PECVD.

The protection film formed using the deposition method according to the present invention may include all of advantages of a protection film deposited by ALD and advantages of a protection film deposited by PECVD.

That is, the first protection layer 410 deposited directly on the OLED 200 may be deposited by ALD and, thus, defects of a surface of the OLED 200 may be overcome by the protection layer with excellent step coverage deposited by ALD. In this case, the thickness of the first protection layer 410 deposited by ALD may be relatively thinned to maintain flexible characteristics while reducing a time required for deposition.

When the second protection layer 430 and the third protection layer 450 are deposited on the first protection layer 410, a protection film including a silicon nitride layer and a silicon oxide layer may be deposited by PECVD and, thus, it may be possible to deposit a protection film having a remarkably thin thickness compared with a conventional protection film while having a low water vapor transmission rate (WVTR) similarly to the prior art.

The first protection layer 410 may be deposited by ALD using a compound including Al, e.g., trimethylaluminum (TMA) as source gas and using $N_2O$ gas as reaction gas.

The first protection layer 410 is deposited directly on the upper surface of the LED 200 and, thus, it may be important to minimize damage of the LED 200 during deposition and, for this reason, when the first protection layer 410 is deposited, trimethylaluminum (TMA) may be used as source gas and $N_2O$ gas may be used as reaction gas for plasma generation. When radical is generated, energy for disconnecting chemical bond of gas molecule may be required. Comparing $N_2O$ gas and $O_2$ gas, oxidation reaction may occur using low energy in the case of $N_2O$ gas compared with $O_2$ gas. Therefore, damage of an LED may be reduced when $N_2O$ gas is used instead of $O_2$ gas.

For example, when the first protection layer 410 is deposited, pressure inside a chamber (not shown) in which a deposition process is performed may be about 0.40 to 0.80 Torr, a supply amount of TMA as the source gas may be about 20 to 70 sccm, a supply amount of $N_2O$ as reaction gas may be about 50 to 200 sccm, a power supply amount for plasma generation may correspond to about 500 to 1500 W, and a supply amount of inert gas (Ar) for purge may correspond to about 4000 to 10000 sccm.

In this case, internal stress of the first protection layer 410 may have a range of about −400 MPa to +400 MPa and a refractive index of the first protection layer 410 may have a value between 1.50 and 1.70.

The second protection layer 430 and the third protection layer 450 may include an inorganic layer and may be deposited by plasma enhanced chemical vapor deposition (PECVD). According to the present exemplary embodiment, to effectively remove a pin hole or the like, which may be generated during the deposition process of the protection film, an inorganic layer including a multiple layer with two or more layers may be formed.

Here, the second protection layer 430 may include a silicon nitride (SiNx) layer having excellent resistance to penetration of oxygen and moisture and the third protection layer 450 may be formed of silicon oxide (SiOx) also having excellent resistance to penetration of oxygen and moisture.

The second protection layer 430 may be deposited using precursor gas, for example, silane ($SiH_4$).

With regard to the characteristics of the second protection layer 430, oxygen and moisture transmittance is equal to or less than $5\times10^{-4}$ g/m²·day, a refractive index has a value of 1.82 to 1.85, and transmissivity in a visible ray range of 380 nm to 800 nm corresponds to 90% or more. Internal stress of the second protection layer 430 may have a value of −100 Mpa to +100 Mpa. According to the present exemplary embodiment, a thickness of the second protection layer 430 may be about 10 to 40 nm and, in this case, deposition rate of the second protection layer 430 may correspond to about 200 nm/min.

The third protection layer 450 formed of silicon oxide may be deposited using an organic precursor and, for example, the third protection layer may be deposited using any one selected from the organic precursor group consisting of tetramethyl-disiloxane (TMDSO), hexaethyl-disilane (HEDS), hexachloro-disilane (HCDS), hexamethyl-disiloxane (HMDSO), and bisdiethylamino-silane (BDEAS).

With regard to the characteristics of the third protection layer 450, a refractive index has a value of 1.45 to 1.5 and transmissivity in a visible ray range of 380 nm to 800 nm corresponds to 95% or more. Internal stress of the third protection layer 450 may have a value of −100 Mpa to +100 Mpa. According to the present exemplary embodiment, a thickness of the third protection layer 450 may be about 40 to 140 nm and, in this case, deposition rate of the third protection layer 450 may correspond to about 150 nm/min.

With regard to the second protection layer 430 and the third protection layer 450, the second protection layer 430 formed of silicon nitride may have excellent characteristics as a protection film, for example, characteristics such as a WVTR compared with the third protection layer 450 formed of silicon oxide but may have relatively low characteristics in terms of transmissivity. Accordingly, when the additional protection layer 420 including the second protection layer 430 formed of silicon nitride and the third protection layer 450 formed of silicon oxide is deposited, a thickness ratio of the second protection layer 430 and the third protection layer 450 may be about 0.2 to 0.4:1. That is, the second protection layer 430 may be formed with a relatively thinner thickness than the thickness of the third protection layer 450. In the case of the above structure, the protection film 400 of the light-emitting diode may maintain the characteristics as a protection film while maintaining transmissivity like in the prior art.

According to the present exemplary embodiment, a thickness of the protection film 400 of the light-emitting diode, including the first protection layer 410, the second protection layer 430, and the third protection layer 450, may be about 60 to 200 nm. Differently from the case in which a thickness of a protection film deposited using a conventional chemical vapor deposition method is about 700 nm to 1000 nm, a protection film deposited using the deposition method according to the present invention may achieve a similar effect to an effect according to the prior art while having a thickness of about ¼ to ¹⁄₂₀ of the thickness of the conventional protection film.

This is because the light-emitting diode protection film according to the present invention has a multi-layered structure formed of silicon nitride and silicon oxide and has a ratio of about 0.2 to 0.4:1 between the thickness of the second protection layer formed of silicon nitride and the thickness of the third protection layer formed of silicon oxide. That is, the second protection layer 430 formed of silicon nitride with a relatively thin thickness may have relatively low transmissivity but may provide characteristics as a protection film and the third protection layer 450 formed of silicon oxide with a relatively thick thickness may provide characteristics of relatively high transmissivity.

In this case, according to the present exemplary embodiment, the thickness of the first protection layer 410 may be about 10 to 20 nm, the thickness of the second protection layer 430 may be about 10 to 40 nm, and the thickness of the third protection layer 450 may be about 40 to 140 nm.

Figure 4:
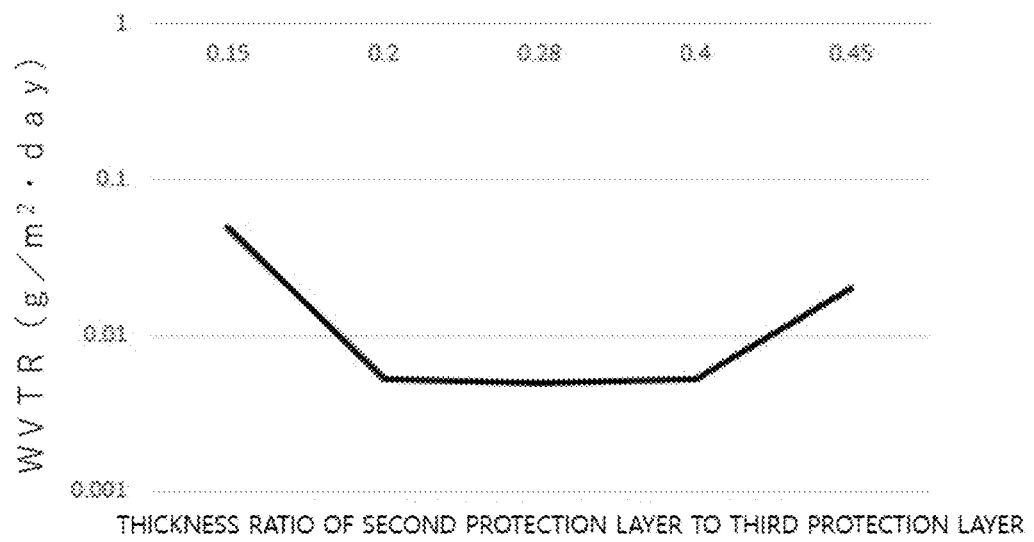
FIG. 4 is a graph showing a water vapor transmission rate (WVTR) value depending on a thickness ratio of a first protection layer to a second protection layer.

The present applicant performs an experiment for comparison of a change in WVTR and visible ray transmissivity depending on a change in thickness ratio of the second protection layer 430 and the third protection layer 450 and, the experimental result is illustrated in FIG. 4. In FIG. 4, the horizontal axis refers to a thickness ratio of the second protection layer 430 to the thickness of the third protection layer 450 assuming that the thickness of the third protection layer 450 to be '1' and the vertical axis refers to a WVTR ($g/m^2$-day) of the protection film.

As seen from FIG. 4, when a thickness ratio of the thickness of the second protection layer 430 to the thickness of the third protection layer 450 is in the range of 0.2 to 0.4, the WVTR value may be about $5 \times 10^{-3}$ $g/m^2$-day and, on the other hand, when the thickness ratio is outside the range, the WVTR value may increase to about $2 \times 10^{-2}$ $g/m^2$-day to about $5 \times 10^{-2}$ $g/m^2$-day. That is, it may be seen that, when the thickness ratio of the second protection layer 430 to the thickness of the third protection layer 450 is outside the range of 0.2 to 0.4, the WVTR value increases to about 4 times to 10 times or more. As a result, it may been seen that, when a thickness ratio of the second protection layer 430 to the third protection layer 450 is 0.2 to 0.4, which corresponds to a ratio according to the present invention, a WVTR value is relatively low.

According to the present exemplary embodiment, as described above, when the second protection layer 430 and the third protection layer 450 with different characteristics are deposited, the second protection layer 430 and the third protection layer 450 may be deposited in one apparatus. The second protection layer 430 and the third protection layer 450 may be deposited in one apparatus to reduce a time required for a deposition process. In this case, to distinguish between layers included in the multi-layered protection film, at least one of deposition conditions, e.g., a type of precursor gas, a supply flow amount of precursor, a supply flow amount of reaction gas, and/or RF power may be changed.

In detail, the aforementioned second protection layer 430 and third protection layer 450 may be deposited in the same chamber at the same temperature range. That is, to deposit a protection film formed of silicon nitride and silicon oxide, the second protection layer 430 and the third protection layer 450 may be deposited by changing a type and/or flow amount of source gas and reaction gas for plasma generation while maintaining the same temperature range in the same chamber. Accordingly, both deposition of the second protection layer and deposition of the third protection layer may be performed in one chamber and thus, throughput may be increased. In particular, deposition may be performed in the same temperature range and thus, deposition efficiency may be further enhanced.

For example, the second protection layer 430 may use precursor gas, e.g., silane ($SiH_4$), substrate temperature for deposition may correspond to about 80° C., and $NH_3$ or $N_2$ may be used as reaction gas. In this case, RF power density for plasma generation may correspond to about 0.34 to 0.58 $W/cm^2$.

As described above, the third protection layer 450 may be deposited using any one selected from the organic precursor group consisting of tetramethyl-disiloxane (TMDSO), hexa-ethyl-disilane (HEDS), hexachloro-disilane (HCDS), hexamethyl-disiloxane (HMDSO), and bisdiethylamino-silane (BDEAS). In this case, substrate temperature for deposition may correspond to about 80° C. that is similar to temperature of the second protection layer 430 and $O_2$ or Ar may be used as reaction gas. In this case, RF power density for plasma generation may correspond to about 0.63 to 0.87 $W/cm^2$.

Among the above properties, comparing the internal stress of the first protection layer 410, the second protection layer 430, and the third protection layer 450, internal stress of the first protection layer 410 deposited directly on the upper surface of the LED 200 may be relatively greater than internal stress of the second protection layer 430 and the third protection layer 450. According to an experiment of the present applicant, when a multi-layered protection film is deposited on the upper surface of the LED 200, if internal stress is reduced upward from the upper surface of the LED 200, the protection film 400 of the LED may be firmly attached to the LED 200. On the other hand, when internal stress is increased upward from the upper surface of the LED 200, the LED 200 may peel off from a substrate by the protection film 400 of the LED. As a result, like in the present embodiment, when a protection film with a multiple structure formed of an inorganic layer is configured, internal stress of each protection film may be reduced upward from the upper surface of the LED 200.

Figure 5:
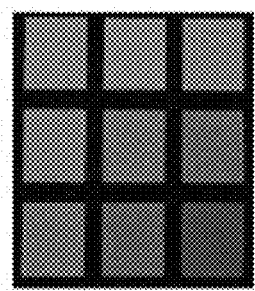
FIG. 5 is an image of an experimental result based on a difference in internal stress of inorganic protection films deposited on a light-emitting diode (LED).
Figure 5:
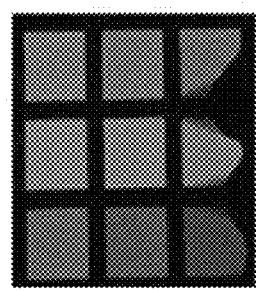

FIG. 5 is an image of an experimental result based on a difference in internal stress of a plurality of protection films when the protection films are deposited on a plurality of LEDs. The experiment is performed by evaluation of high-temperature and high-humidity reliability and, in this case, a high-temperature condition is 85° C. and a high-humidity condition is 85% RH.

In this case, FIG. 5A shows the case in which internal stress of a first protection layer positioned on an upper surface of an LED is relatively greater than internal stress of a second protection layer and, on the other hand, FIG. 5B shows the case in which internal stress of the second protection layer is relatively greater than internal stress of the first protection layer positioned on the upper surface of the LED.

Referring to FIG. 5, a passivation effect of a thin film is evaluated by evaluation of high-temperature and high-humidity reliability of an OLED and, as seen from FIG. 5A, a passivation effect is excellent without a change in an LED when the internal stress of the first protection layer positioned on the upper surface of the LED is relatively greater than the internal stress of the second protection layer.

On the other hand, as seen from FIG. 5B, an LED may shrink due to penetration of moisture, impurities, or the like when the internal stress of the second inorganic protection layer is relatively greater than the internal stress of the first inorganic protection layer positioned on the upper surface of the LED.

Figure 6:
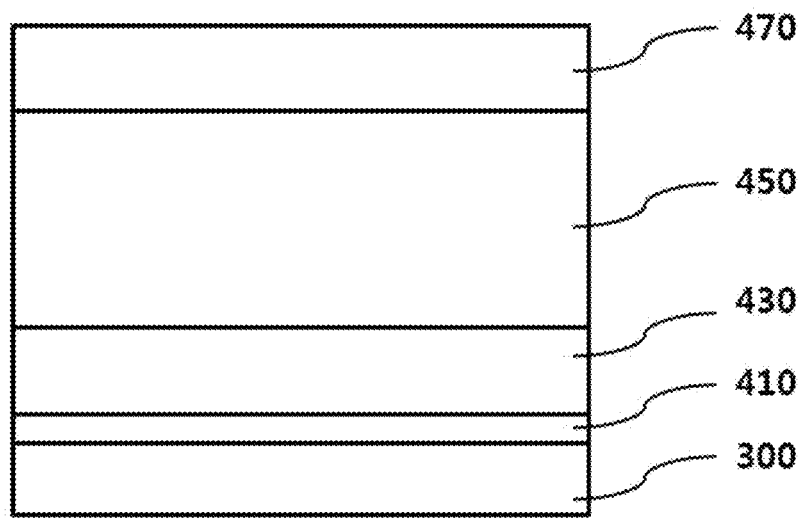
FIG. 6 is a cross-sectional view showing a protection film according to another exemplary embodiment of the present invention.

FIG. 6 is a cross-sectional view showing a protection film according to another embodiment of the present invention.

Referring to FIG. 6, the protection film of the LED according to the present exemplary embodiment may further include buffer layer 470 on the third protection layer 450. A deposition process may further include depositing the buffer layer 470 on the third protection layer 450 subsequently to the depositing of the third protection layer 450.

The buffer layer 470 may include silicon oxide (SiOC) including carbon and may surround a particle or the like, which may be generated during deposition, to prevent penetration of oxygen and moisture and to alleviate defects generated on a surface and internal stress. A refractive index and thickness of the buffer layer 470 may be adjusted to enhance the optical characteristics of the protection film of the LED.

In this case, the buffer layer 470 may include a silicon oxide layer deposited by PECVD in the same way as the aforementioned second protection layer 430 and third protection layer 450.

In detail, the buffer layer 470 may be deposited using any one selected from the organic precursor group consisting of tetramethyl-disiloxane (TMDSO), hexaethyl-disilane (HEDS), hexachloro-disilane (HCDS), hexamethyl-disiloxane (HMDSO), and bisdiethylamino-silane (BDEAS) similarly to the aforementioned third protection layer 450. Thin film stress of the buffer layer 470 may have a value of −50 Mpa to +50 Mpa and deposition rate may be equal to or greater than 250 nm/min.

According to the present exemplary embodiment, when the buffer layer 470 is deposited on the third protection layer 450, the buffer layer 470 may be deposited using an organic precursor of the third protection layer 450 without a change of the organic precursor. That is, silicon oxide layers included in the third protection layer 450 and the buffer layer 470 may be deposited using the same organic precursor by changing a gas amount, plasma power, process pressure, and so on.

For example, the depositing of the buffer layer and the depositing of the third protection layer may be continuously performed while adjusting a supply amount of the organic precursor and/or the reaction gas.

As described above, the organic precursor may be any one selected from the organic precursor group consisting of tetramethyl-disiloxane (TMDSO), hexaethyl-disilane (HEDS), hexachloro-disilane (HCDS), hexamethyl-disiloxane (HMDSO), and bisdiethylamino-silane (BDEAS). That is, according to the present invention, an organic precursor may be supplied and oxygen or the like may be supplied as reaction gas to deposit the third protection layer 450 formed of silicon oxide and, furthermore, the gas amount or the like may be adjusted to deposit the buffer layer 470 formed of silicon oxide including carbon.

To supply the aforementioned organic precursor to deposit the third protection layer 450 formed of silicon oxide (SiOx), it may be important to remove a methyl group ($CH_3$) of the organic precursor. This is because, when the methyl group is not sufficiently removed, a SiOC-based film is formed.

Accordingly, when the organic precursor is supplied to deposit the third protection layer formed of silicon oxide (SiOx), desirably, the aforementioned supply amount of the organic precursor may be reduced and the supply amount of the reaction gas may be relatively increased.

For example, when the third protection layer is deposited, substrate temperature for deposition may correspond to about 80° C., the supply amount of the organic precursor may be 40 to 50 sccm, the supply amount of $O_2$ as reaction gas may be about 1500 sccm, and the supply amount of Ar may be about 1500 sccm. In addition, RF power for plasma generation may correspond to about 1300 W.

On the other hand, to deposit a buffer layer formed of silicon oxide (SiOC) including carbon, a supply amount of an organic precursor may be relatively increased and a supply amount of reaction gas may be reduced compared with the case in which the aforementioned third protection layer formed of a SiOx compound is deposited. It may not be largely required to remove a methyl group when a buffer layer formed of a SiOC compound is deposited and, thus, it may not be required to reduce the supply amount of the organic precursor and, accordingly, the supply amount of reaction gas including oxygen or the like may be reduced.

For example, when the buffer layer is deposited, substrate temperature for deposition may be about 80° C., the supply amount of the organic precursor may be about 120 to 130 sccm, the supply amount of $O_2$ as reaction gas may be about 500 sccm, and the supply amount of Ar may be about 2500 sccm. In addition, RF power for plasma generation may correspond to about 1300 W.

As a result, it may be seen that the supply amount of the reaction gas is oppositely reduced while the supply amount of the organic precursor is increased as the depositing of the third protection layer proceeds to the depositing of the buffer layer.

In this case, the third protection layer may prevent penetration of moisture and the buffer layer may be used to provide flexibility to a multi-layered protection film. A protection film formed of a SiOC compound may have a relatively high WVTR but may have excellent flexibility compared with a protection film formed of a SiOx compound. Accordingly, when the buffer layer is deposited on the third protection layer, it may be possible to deposit a protection film that is flexible while preventing penetration of moisture.

According to the present exemplary embodiment, the depositing of the first protection layer 410 and the depositing of the additional protection layer 420 may be repeatedly performed to deposit a multi-layered protection film.

While the present invention has been shown and described in connection with the preferred embodiments, it will be apparent to those skilled in the art that modifications and variations can be made without departing from the spirit and scope of the invention as defined by the appended claims. Accordingly, when the modifications and variations include the components of claims, they are within the technological scope of the present invention.

According to the present invention, all of advantages of a protection film deposited by atomic layer deposition (ALD) and advantages of a protection film deposited by plasma enhanced chemical vapor deposition (PECVD) may be achieved.

That is, a first protection layer deposited on a light-emitting diode (LED) may be deposited by ALD and, thus, defects of a surface of the LED may be overcome by the protection layer with excellent step coverage deposited by ALD. In this case, the thickness of the first protection layer deposited by ALD may be relatively thinned to maintain flexible characteristics while reducing a time required for deposition.

When a second protection layer and a third protection layer are deposited on the first protection layer, it may be possible to deposit a protection film that has a remarkably thin thickness compared with a conventional protection film while having a low WVTR similarly to the prior art by depositing a protection film including a silicon nitride layer and a silicon oxide layer by plasma enhanced chemical vapor deposition (PECVD).

A multi-layered protection film including a second protection layer with low moisture transmissivity and a third protection layer with flexible characteristics may be provided and, thus, may be applicable to a flexible display device while preventing penetration of moisture and oxygen as much as possible.

In addition, the second protection layer and the third protection layer may be deposited in the same apparatus and, thus, a processing time required for deposition may be relatively reduced.

The invention claimed is:

1. A method of depositing a protection film for a light emitting diode (LED), the method comprising:
   depositing a first protection layer on an LED substrate by atomic layer deposition (ALD);
   depositing a second protection layer on the first protection layer by plasma enhanced chemical vapor deposition; and
   depositing a third protection layer on the second protection layer by plasma enhanced chemical vapor deposition,
   wherein internal stress of the first protection layer is greater than that of the second protection layer, and internal stress of the second protection layer is greater than that of the third protection layer, such that the internal stress is reduced upward from an upper surface of the LED, and
   wherein depositing of the second protection layer and depositing of the third protection layer are continuously performed in a same chamber.

2. The method of claim 1, wherein the first protection layer is formed of an aluminum oxide ($AlO_x$) layer deposited by ALD, the second protection layer is formed of silicon nitride ($SiN_x$) deposited on the first protection layer by plasma enhanced chemical vapor deposition, and the third protection layer is formed of silicon oxide ($SiO_x$) deposited on the second protection layer by plasma enhanced chemical vapor deposition.

3. The method of claim 2, wherein, in the depositing of the first protection layer, a compound including aluminum (Al) is supplied as source gas and $N_2O$ is supplied as reaction gas.

4. The method of claim 2, wherein, in the depositing of the second protection layer, silane ($SiH_4$) gas is supplied as precursor gas, $NH_3$ or $N_2$ is supplied as reaction gas, and RF power density for plasma generation has a value of 0.34 to 0.58 $W/cm^2$.

5. The method of claim 2, wherein, in the depositing of the third protection layer, any one selected from an organic precursor group consisting of tetramethyl-disiloxane (TMDSO), hexaethyl-disilane (HEDS), hexamethyl-disiloxane (HMDSO), and bisdiethylamino-silane (BDEAS) is supplied, $O_2$ or Ar is supplied as reaction gas, and RF power density for plasma generation has a value of 0.63 to 0.87 $W/cm^2$.

6. The method of claim 2, further comprising depositing a buffer layer on the third protection layer.

7. The method of claim 6, wherein the buffer layer is formed of silicon oxide including carbon.

8. The method of claim 7, wherein the depositing of the buffer layer and the depositing of the third protection layer use the same organic precursor.

9. The method of claim 8, wherein the depositing of the third protection layer and the depositing of the buffer layer are successively performed.

10. The method of claim 9, wherein, as the depositing of the third protection layer proceeds to the depositing of the buffer layer, a supply amount of the reaction gas is relatively reduced while a supply amount of the organic precursor is relatively increased.

11. The method of claim 2, wherein a thickness ratio of the second protection layer and the third protection layer is about 0.2 to 0.4:1.

12. The method of claim 2, wherein a total thickness including the first to third protection layers is 60 to 200 nm.

13. The method of claim 2, wherein the first protection layer has a thickness of 10 to 20 nm, the second protection layer has a thickness of 10 to 40 nm, and the third protection layer has a thickness of 40 to 140 nm.

14. The method of claim 2, wherein, in the depositing of the first, second, and third protection layers, the first, second, and third protection layers have reduced internal stress upward from the LED.

15. The method of claim 1, wherein the depositing of the first protection layer, the depositing of the second protection layer, and the depositing of the third protection layer are repeatedly performed to deposit a multi-layered protection film.

* * * * *